United States Patent
Wang et al.

[11] Patent Number: 6,017,791
[45] Date of Patent: Jan. 25, 2000

[54] MULTI-LAYER SILICON NITRIDE DEPOSITION METHOD FOR FORMING LOW OXIDATION TEMPERATURE THERMALLY OXIDIZED SILICON NITRIDE/SILICON OXIDE (NO) LAYER

[75] Inventors: Chen-Jong Wang; Chue-San Yoo; Kuo-Hsien Cheng, all of Hsin-Chu, Taiwan

[73] Assignee: Taiwan Semiconductor Manufacturing Company, Hsin-Chu, Taiwan

[21] Appl. No.: 08/967,655

[22] Filed: Nov. 10, 1997

[51] Int. Cl.[7] ................................. H01L 21/8242
[52] U.S. Cl. .................. 438/253; 438/787; 438/786; 438/954
[58] Field of Search ............................. 438/238, 239, 438/253, 261, 396, 397, 398, 758, 761, 787, 791, 954, 909, 958, 786, 240; 257/303, 288

[56] References Cited

U.S. PATENT DOCUMENTS

| | | | |
|---|---|---|---|
| 4,448,633 | 5/1984 | Shuskus | 156/610 |
| 4,577,390 | 3/1986 | Haken | 29/570 |
| 4,746,630 | 5/1988 | Hui et al. | 437/235 |
| 5,091,327 | 2/1992 | Bergemont | 437/43 |
| 5,521,112 | 5/1996 | Tseng | 437/52 |
| 5,792,688 | 8/1998 | Tseng | 438/253 |
| 5,793,075 | 8/1998 | Alsmeier et al. | 257/296 |
| 5,824,560 | 10/1998 | Van Der Wel et al. | 437/31 |
| 5,907,183 | 5/1999 | Takeuchi | 257/640 |
| 5,926,719 | 7/1999 | Sung | 438/396 |
| 5,930,624 | 7/1999 | Murata et al. | 438/253 |
| 5,945,711 | 8/1999 | Takemura et al. | 257/344 |

*Primary Examiner*—Joni Chang
*Assistant Examiner*—Robert A. Hullinger
*Attorney, Agent, or Firm*—George O. Saile; Stephen B. Ackerman; Alek P. Szecsy

[57] ABSTRACT

A method for forming a silicon nitride/silicon oxide (NO) layer within a microelectronics fabrication, and the microelectronics fabrication having the silicon nitride/silicon oxide (NO) layer formed therein. There is first provided a substrate employed within a microelectronics fabrication. There is then formed over the substrate a first silicon nitride layer through a first deposition method. There is then formed upon the first silicon nitride layer a second silicon nitride layer through a second deposition method. Finally, there is annealed thermally in an oxidizing environment the first silicon nitride layer and the second silicon nitride layer to form therefrom a silicon nitride/silicon oxide (NO) layer. The silicon nitride/silicon oxide (NO) layer may be formed with optimized resistivity properties at a reduced thermal annealing temperature and/or a reduced thermal annealing exposure time in comparison with an otherwise equivalent silicon nitride/silicon oxide (NO) layer formed through thermal annealing a single silicon nitride layer of thickness equivalent to the thickness of the first silicon nitride layer plus the thickness of the second silicon nitride layer. When formed upon a silicon oxide dielectric layer in turn formed upon a first capacitor plate within a capacitor within an integrated circuit, there may be formed employing the silicon nitride/silicon oxide (NO) layer a silicon oxide/silicon nitride/silicon oxide (ONO) capacitive dielectric layer.

15 Claims, 3 Drawing Sheets

MULTI-LAYER SILICON NITRIDE DEPOSITION METHOD FOR FORMING LOW OXIDATION TEMPERATURE THERMALLY OXIDIZED SILICON NITRIDE/ SILICON OXIDE (NO) LAYER

BACKGROUND OF THE INVENTION

1. Field of the Invention

The present invention relates generally to methods for forming silicon nitride/silicon oxide (NO) layers typically employed within silicon oxide/silicon nitride/silicon oxide (ONO) dielectric layers within microelectronics fabrications. More particularly, the present invention relates to low oxidation temperature silicon nitride thermal oxidation methods for forming silicon nitride/silicon oxide (NO) layers typically employed within silicon oxide/silicon nitride/ silicon oxide (ONO) dielectric layers within microelectronics fabrications.

2. Description of the Related Art

Common in the art of microelectronics fabrication is the use of silicon nitride/silicon oxide (NO) composite layers as dielectric layers. Silicon nitride/silicon oxide (NO) composite layers as dielectric layers within microelectronics fabrications are desirable since silicon nitride/silicon oxide (NO) composite layers often provide dielectric layers having improved dielectric properties in comparison with otherwise equivalent silicon oxide layers which are conventionally employed as dielectric layers within microelectronics fabrications.

Silicon nitride/silicon oxide (NO) composite layers may be formed within any of several types of microelectronics fabrications and also within any of several dielectric layer locations within the several types of microelectronics fabrications. Silicon nitride/silicon oxide (NO) composite layers may be formed within microelectronics fabrications including but not limited to integrated circuit microelectronics fabrications, solar cell microelectronics fabrications, ceramic packaging microelectronics fabrications and flat panel display microelectronics fabrications.

Of the methods for forming silicon nitride/silicon oxide (NO) composite layers within microelectronics fabrications, a particularly common method is a thermal oxidation method where a silicon nitride layer is formed within a microelectronics fabrication and subsequently thermally oxidized through thermal annealing within an oxygen containing atmosphere to form a silicon nitride/silicon oxide (NO) layer. Typically, the silicon nitride layer from which is formed the silicon nitride/silicon oxide (NO) layer through the thermal oxidation method is formed through a thermal chemical vapor deposition (CVD) method at a temperature of from about 500 to about 800 degrees centigrade, while the thermal chemical vapor deposited (CVD) silicon nitride layer so formed is subsequently thermally annealed within the oxygen containing atmosphere at an appropriate thermal annealing temperature and for a sufficient thermal annealing exposure time to form from the silicon nitride layer the silicon nitride/silicon oxide (NO) layer with optimal dielectric properties for use within the microelectronics fabrication. Typical thermal annealing temperature and thermal annealing exposure time conditions which provide silicon nitride/silicon oxide (NO) layers within optimal dielectric properties within microelectronics fabrications include an 800–900 degrees centigrade thermal annealing temperature for a thermal annealing exposure time of greater than about 30 minutes.

Although silicon nitride/silicon oxide (NO) layers formed through thermal oxidation methods which employ thermal annealing of silicon nitride layers within oxygen containing atmospheres in accord with the foregoing thermal annealing conditions provide within microelectronics fabrications silicon nitride/silicon oxide (NO) layers with optimal dielectric properties, such silicon nitride/silicon oxide (NO) layers are often not formed entirely without problems within those microelectronics fabrications. In particular, it is known in the art of microelectronics fabrication that the elevated thermal annealing temperatures and extended thermal annealing exposure times through which silicon nitride layers are thermally annealed within oxygen containing atmospheres to form silicon nitride/silicon oxide (NO) layers within microelectronics fabrications are often sufficiently elevated and/or extended to compromise the integrity of other microelectronics structures and/or other microelectronics layers within a microelectronics fabrication within which is formed a silicon nitride/silicon oxide (NO) layer through the thermal oxidation method. Such other microelectronics structures and microelectronics layers may include, but are not limited to: microelectronics conductor structures and layers; microelectronics semiconductor structures and layers; and microelectronics insulator structures and layers. In particular, within integrated circuit microelectronics fabrications within which there are formed metal silicide conductor contact layers or metal silicide conductor contact structures, the foregoing thermal annealing temperatures and thermal annealing exposure times at which silicon nitride layers are thermally oxidized through thermal annealing within oxygen containing atmospheres to form silicon nitride/silicon oxide (NO) layers within integrated circuit microelectronics fabrications are often sufficiently elevated and/or extended to provide oxidation induced contact resistance deterioration or sheet resistance deterioration of those metal silicide conductor contact layers or metal silicide conductor contact structures.

It is thus in general towards forming within microelectronics fabrications silicon nitride/silicon oxide (NO) layers through thermal oxidation methods which employ thermal annealing of silicon nitride layers within thermally oxidizing atmospheres, such as oxygen containing atmospheres, while simultaneously avoiding thermal oxidation induced deterioration of other microelectronics layers and/or other microelectronics structures within those microelectronics fabrications that the present invention is generally directed.

Various methods have been disclosed in the art of integrated circuit microelectronics fabrication for forming novel nitride layers or novel nitride layer containing structures within those integrated circuits.

For example, Shuskus in U.S. Pat. No. 4,448,633 discloses a two-step plasma nitridation method for forming a nitride passivation layer upon the surface of a III-V (typically gallium arsenide) semiconductor substrate employed within an integrated circuit microelectronics fabrication. The first step within the two-step plasma nitridation method employs a comparatively low temperature to prevent semiconductor substrate surface decomposition and loss of the V component, while the second step within the two-step plasma nitridation method employs a comparatively higher temperature at which the plasma nitridation method proceeds more rapidly.

In addition, Bergemont, in U.S. Pat. No. 5,091,327 discloses a method for forming a high density stacked gate erasable programmable read-only memory (EPROM) split cell structure within an integrated circuit microelectronics fabrication, where the erasable programmable read-only memory (EPROM) split cell structure employs a silicon oxide/silicon nitride/silicon oxide (ONO) dielectric layer interposed between a floating gate and a control gate. Within the high density split gate erasable programmable read-only memory (EPROM) split cell structure formed through the method, there is eliminated bit line to bit line reach through.

Finally, Tseng, in U.S. Pat. No. 5,521,112 discloses a method for forming a stacked storage capacitor for use within a dynamic random access memory (DRAM) cell within an integrated circuit microelectronics fabrication, where the stacked capacitor may employ a silicon oxide/silicon nitride/silicon oxide (ONO) capacitive dielectric layer. Through the method there is formed within the dynamic random access memory (DRAM) cell within the integrated circuit microelectronics fabrication a stacked storage capacitor of increased areal capacitance.

Desirable in the arts of microelectronics fabrication are thermal oxidation methods employing thermal annealing within thermal oxidizing atmospheres, such as oxygen containing atmospheres, for forming silicon nitride/silicon oxide (NO) layers from silicon nitride layers within microelectronics fabrications while simultaneously avoiding thermal oxidation induced deterioration of other microelectronics layers and/or other microelectronics structures within those microelectronics fabrications. More particularly desirable in the art of integrated circuit microelectronics fabrication are thermal oxidation methods employing thermal annealing within thermal oxidizing atmospheres, such as oxygen containing atmospheres, for forming silicon nitride/silicon oxide (NO) layers from silicon nitride layers within integrated circuit microelectronics fabrications while simultaneously avoiding thermal oxidation induced deterioration of other integrated circuit layers and/or other integrated circuit structures, such as but not limited to metal silicide conductor contact layers and metal silicide conductor contact structures, within those integrated circuit microelectronics fabrications. It is towards the foregoing goals that the present invention is more specifically directed.

SUMMARY OF THE INVENTION

A first object of the present invention is to provide a thermal oxidation method for forming a silicon nitride/silicon oxide (NO) layer from a silicon nitride layer within a microelectronics fabrication.

A second object of the present invention is to provide a method in accord with the first object of the present invention, where there is simultaneously avoided thermal oxidation induced deterioration of other microelectronics layers and microelectronics structures, such as but not limited to metal silicide conductor contact layers and metal silicide conductor contact structures, within the microelectronics fabrication when the silicon nitride/silicon oxide (NO) layer is formed from the silicon nitride layer through the thermal oxidation method.

A third object of the present invention is to provide a method in accord with the first object of the present invention or the second object of the present invention, where the microelectronics fabrication is an integrated circuit microelectronics fabrication and the silicon nitride/silicon oxide (NO) layer is employed as a capacitive dielectric layer within the integrated circuit microelectronics fabrication, such as but not limited to a capacitive dielectric layer within a storage capacitor within a dynamic random access memory (DRAM) cell within the integrated circuit microelectronics fabrication.

A fourth object of the present invention is to provide a method in accord with the first object of the present invention, the second object of the present invention or the third object of the present invention, which method is readily manufacturable.

In accord with the objects of the present invention, there is provided by the present invention a method for forming a silicon nitride/silicon oxide (NO) layer within a microelectronics fabrication. To practice the method of the present invention, there is provided a substrate employed within a microelectronics fabrication. There is then formed over the substrate a first silicon nitride layer through a first deposition method. There is then formed upon the first silicon nitride layer at least a second silicon nitride layer through a second deposition method. Finally, there is then annealed thermally in an oxidizing environment at least the first silicon nitride layer and the second silicon nitride layer to form therefrom a silicon nitride/silicon oxide (NO) layer.

There is provided by the present invention a thermal oxidation method for forming a silicon nitride/silicon oxide (NO) layer from a silicon nitride layer within a microelectronics fabrication, where there is simultaneously avoided thermal oxidation induced deterioration of other microelectronics structures and other microelectronics layers when forming within the microelectronics fabrication the silicon nitride/silicon oxide (NO) layer from the silicon nitride layer through the thermal oxidation method. The method of the present invention realizes this object by employing when forming the silicon nitride/silicon oxide (NO) layer through the thermal oxidation method a minimum of a bilayer multilayer silicon nitride layer formed from at least a first silicon nitride layer formed through a first deposition method having formed thereupon a second silicon nitride layer formed through a second deposition method. By employing through the method of the present invention the multilayer silicon nitride layer when forming through the thermal oxidation method a silicon nitride/silicon oxide (NO) layer rather than a monolayer silicon nitride layer (ie: a single silicon nitride layer formed through a single deposition method) as is conventionally employed when forming through a thermal oxidation method a silicon nitride/silicon oxide (NO) layer within a microelectronics fabrication, the silicon nitride/silicon oxide (NO) layer formed through the method of the present invention may be formed through a thermal oxidation method employing a lower thermal annealing temperature and/or a reduced thermal annealing exposure time. Thus, there is provided by the present invention a thermal oxidation method for forming a silicon nitride/silicon oxide (NO) layer from a silicon nitride layer within a microelectronics fabrication, where there is simultaneously avoided thermal oxidation induced deterioration of other microelectronics layers and other microelectronics structures within the microelectronics fabrication.

The method of the present invention may be employed where the microelectronics fabrication is an integrated circuit microelectronics fabrication. The method of the present invention does not discriminate with respect to the nature of the microelectronics fabrication within which is formed a silicon nitride/silicon oxide (NO) layer through the method of the present invention. Thus, although the method of the present invention is most likely to provide value in forming a silicon nitride/silicon oxide (NO) layer within a silicon oxide/silicon nitride/silicon oxide (ONO) layer which in turn is employed as a capacitive dielectric layer within a capacitor within an integrated circuit microelectronics fabrication while avoiding thermal oxidation induced damage to other integrated circuit structures and integrated circuit layers within the integrated circuit microelectronics fabrication, the method of the present invention may also be employed in forming silicon nitride/silicon oxide (NO) layers within microelectronics fabrications including but not limited to integrated circuit microelectronics fabrications, solar cell microelectronics fabrications, ceramic packaging microelectronics fabrications and flat panel display microelectronics fabrications.

The method of the present invention is readily manufacturable. The method of the present invention employs a minimum of a bilayer multilayer silicon nitride layer rather than a monolayer silicon nitride layer when forming within a microelectronics fabrication from the multilayer silicon nitride layer a silicon nitride/silicon oxide (NO) layer through a thermal oxidation method. Since methods for forming silicon nitride layers are generally known in the art of microelectronics fabrication, methods for forming multilayer silicon nitride layers from multiple adjacent silicon nitride layers within those microelectronics fabrications are readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
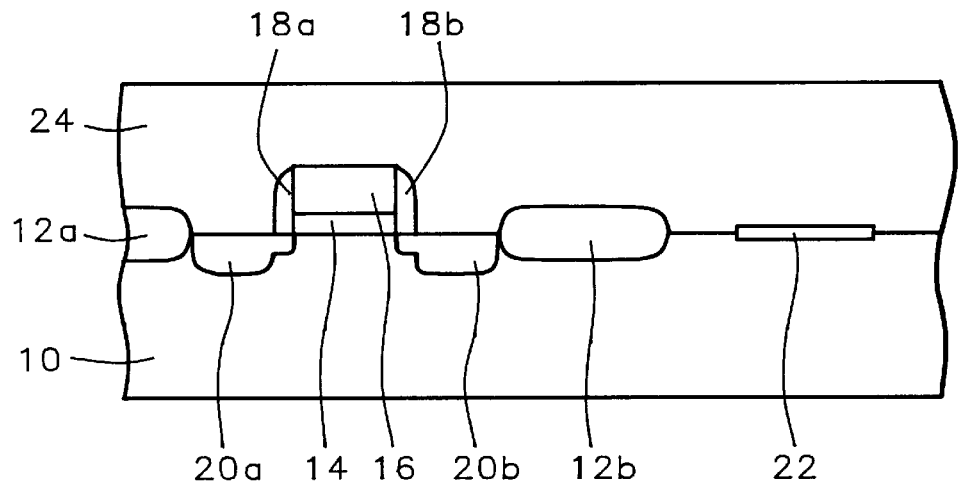
FIG. 1 to FIG. 5 show a series of schematic cross-sectional diagrams illustrating the results of progressive process stages in forming within an integrated circuit microelectronics fabrication a dynamic random access memory (DRAM) cell having formed therein a storage capacitor which in turn has formed therein a silicon oxide/silicon nitride/silicon oxide (ONO) capacitive dielectric layer formed in part through a thermal oxidation method in accord with the preferred embodiment of the present invention.

There is provided by the present invention a thermal oxidation method for forming a silicon nitride/silicon oxide (NO) layer from a silicon nitride layer within a microelectronics fabrication, where there is simultaneously avoided thermal oxidation induced deterioration of other microelectronics structures and other microelectronics layers within the microelectronics fabrication when forming the silicon nitride/silicon oxide (NO) layer from the silicon nitride layer through the thermal oxidation method. The method of the present invention realizes this object by employing when forming the silicon nitride/silicon oxide (NO) layer a multilayer silicon nitride layer formed from a minimum of a first silicon nitride layer formed through a first deposition method having formed thereupon a second silicon nitride layer formed through a second deposition method. By employing through the method of the present invention the multilayer silicon nitride layer when forming through the thermal oxidation method the silicon nitride/silicon oxide (NO) layer, rather than a monolayer silicon nitride layer when forming the silicon nitride/silicon oxide (NO) layer, the silicon nitride/silicon oxide (NO) layer formed through the method of the present invention may be formed through a thermal oxidation method employing a lower thermal annealing temperature and/or a reduced thermal annealing exposure time. Thus, there is provided by the present invention a thermal oxidation method for forming a silicon nitride/silicon oxide (NO) layer from a silicon nitride layer within a microelectronics fabrication, where there is simultaneously avoided thermal oxidation induced deterioration of other microelectronics structures and other microelectronics layers within the microelectronics fabrication.

Although the preferred embodiment of the present invention illustrates the present invention employed in forming within an integrated circuit microelectronics fabrication a dynamic random access memory (DRAM) integrated circuit cell having formed therein a storage capacitor which in turn has formed therein a silicon oxide/silicon nitride/silicon oxide (ONO) capacitive dielectric layer formed in part through the method of the present invention, the present invention may also be employed in forming silicon nitridel-silicon oxide (NO) layers as layers other than capacitive dielectric layers within microelectronics fabrications other than integrated circuit microelectronics fabrications. In that regard, the present invention may be employed in forming silicon nitride/silicon oxide (NO) layers as dielectric layers including but not limited to capacitive dielectric layers, pre-metal dielectric (PMD) layers, inter-metal dielectric (IMD) layers, passivation (ie: post metal) dielectric layers and other spacer dielectric layers within microelectronics fabrications including but not limited to integrated circuit microelectronics fabrications, solar cell microelectronics fabrications, ceramic packaging microelectronics fabrications and flat panel display microelectronics fabrications.

Referring now to FIG. 1 to FIG. 5, there is shown a series of schematic cross-sectional diagrams illustrating the results of forming within an integrated circuit microelectronics fabrication a dynamic random access memory (DRAM) cell having formed there a storage capacitor which in turn has formed therein a silicon oxide/silicon nitride/silicon oxide (ONO) capacitive dielectric layer formed in part through a thermal oxidation method in accord with the preferred embodiment of the present invention. Shown in FIG. 1 is a schematic cross-sectional diagram of the integrated circuit microelectronics fabrication at an early stage in its fabrication.

Shown in FIG. 1 is a semiconductor substrate 10 having formed within and upon its surface a pair of isolation regions 12a and 12b which define in-part a pair of active regions of the semiconductor substrate 10. Although semiconductor substrates are known in the art of integrated circuit microelectronics fabrication with either dopant polarity, several dopant concentrations and various crystallographic orientations, for the preferred embodiment of the present invention the semiconductor substrate 10 is preferably a (100) silicon semiconductor substrate having an N- or P- doping concentration.

Similarly, although it is also known in the art of integrated circuit microelectronics fabrication that isolation regions may be formed within and/or upon semiconductor substrates to define active regions of those semiconductor substrates through methods including but not limited to isolation region thermal growth methods and isolation region deposition/patterning methods, for the preferred embodiment of the present invention the isolation regions 12a and 12b are preferably formed within and upon the semiconductor substrate 10 to define the active regions of the semiconductor substrate 10 through an isolation region thermal growth method at a temperature of about 900 to about 1100 degrees centigrade to form the isolation regions 12a and 12b of silicon oxide within and upon the semiconductor substrate 10.

Shown also within FIG. 1 formed within or upon a first one of the two active regions of the semiconductor substrate 10 is a series of structures which comprises a field effect transistor (FET). The series of structures includes: (1) a gate dielectric layer 14 formed upon the first one of the active regions of the semiconductor substrate 10; (2) a gate electrode 16 formed and aligned upon the gate dielectric layer 14; (3) a pair of source/drain regions 20a and 20b formed within the first one of the active regions of the semiconductor substrate at areas not covered by the gate dielectric layer 14 and the gate electrode 16; and (4) a pair of dielectric spacer layers 18a and 18b formed adjoining a pair of opposite edges of the gate dielectric layer 14 and the gate electrode 16. Each of the foregoing structures employed in forming the field effect transistor (FET) within the integrated circuit microelectronics fabrication whose schematic cross-sectional diagram is shown in FIG. 1 may be formed through methods and materials as are conventional in the art of integrated circuit microelectronics fabrication.

For example, although it is known in the art of integrated circuit microelectronics fabrication that gate dielectric layers within field effect transistors (FETs) may be formed through patterning, through methods as are conventional in the art, of blanket gate dielectric layers formed through methods including but not limited to blanket gate dielectric layer thermal growth methods and blanket gate dielectric layer deposition methods, for the preferred embodiment of the present invention, the gate dielectric layer 14 is preferably formed through patterning, through methods as are conventional in the art, of a blanket gate dielectric layer formed through a blanket gate dielectric layer thermal growth method to form the gate dielectric layer 14 of silicon oxide upon the first of the active regions of the semiconductor substrate 10. Preferably, the gate dielectric layer 14 of silicon oxide so formed is from about 40 to about 150 angstroms thick.

Similarly, although it is also known in the art of integrated circuit microelectronics fabrication that gate electrodes may be formed through patterning, through methods as are conventional in the art, of blanket layers of gate electrode materials including but not limited to metals, metal alloys, doped polysilicon and polycides (ie: doped polysilicon/metal silicide stacks) formed upon blanket gate dielectric layers within those integrated circuit microelectronics fabrications, for the preferred embodiment of the present invention, the gate electrode 16 is preferably formed through patterning, through methods as are conventional in the art, of a blanket layer of a doped polysilicon material formed upon the blanket gate dielectric layer to a thickness of from about 1000 to about 3000 angstroms.

Further, it is also known in the art of integrated circuit microelectronics fabrication that dielectric spacer layers may be formed through anisotropic etching of blanket layers of dielectric materials including but not limited to silicon oxide dielectric materials, silicon nitride dielectric materials and silicon oxynitride dielectric materials. For the preferred embodiment of the present invention, the dielectric spacer layers 18a and 18b are preferably formed through anisotropic reactive ion etch (RIE) etching of a blanket layer of silicon oxide dielectric material, silicon nitride dielectric material or silicon oxynitride dielectric material to form the pair of dielectric spacer layers 18a and 18b adjoining the pair of opposite edges of the gate dielectric layer 14 and the gate electrode 16.

Finally, it is also known in the art of integrated circuit microelectronics fabrication that source/drain regions are typically formed within an active region of a semiconductor substrate through ion implantation methods employing dopant ions of polarity appropriate to the field effect transistor (FET) desired to be formed. For the preferred embodiment of the present invention, the pair of source/drain regions 20a and 20b is preferably formed within the active region of the semiconductor substrate 10 through: (1) a low dose implant at an ion implantation dose of from about 1E13 to about 1E15 dopant ions per square centimeter and an ion implantation energy of from about 10 to about 50 keV while employing the gate electrode 16 and the gate dielectric layer 14 as a mask; followed by (2) a high dose ion implant at an ion implantation dose of from about 1E15 to about 9E15 dopant ions per square centimeter and an ion implantation energy of from about 30 to about 100 keV while employing the gate electrode 16, the gate dielectric layer 14 and the pair of dielectric spacer layers 18a and 18b as a mask. The polarity of the dopant ion employed in forming the pair of source/drain regions 20a and 20b is appropriate to the semiconductor substrate 10 and the field effect transistor (FET).

There is also shown in FIG. 1 formed upon the semiconductor substrate 10 within the second of the two active regions of the semiconductor substrate 10 peripheral to the first of the two active regions of the semiconductor substrate having the field effect transistor (FET) formed therein and thereupon a metal silicide layers 22. Methods and materials through which metal silicide layers may be formed within integrated circuit microelectronics fabrications are known within the art of integrated circuit microelectronics fabrication. Metal silicide layers may be formed within integrated circuit microelectronics fabrications through methods including but not limited to chemical vapor deposition (CVD) methods and metal deposition/thermal annealing methods through which may be formed metal silicide layers of metal silicides including but not limited to titanium silicide, tungsten silicide, cobalt silicide, molybdenum silicide and platinum silicide. For the preferred embodiment of the present invention, the metal silicide layer 22 is preferably formed through a metal deposition/thermal annealing method through which is formed the metal silicide layer 22 preferably of titanium silicide, although other methods and materials may be employed in forming the metal silicide layer 22.

Within the preferred embodiment of the present invention, it is desired to avoid thermal oxidation induced contact resistance deterioration (ie: contact resistance increases) of the metal silicide layer 22 when forming through the preferred embodiment of the present invention a silicon nitride/silicon oxide (NO) layer through thermal oxidation of a silicon nitride layer subsequently formed over the integrated circuit microelectronics fabrication whose schematic cross-sectional diagram is illustrated in FIG. 1.

Finally, there is shown in FIG. 1 the presence of a blanket planarized inter-polysilicon oxide (IPO) layer 24 formed upon the integrated circuit microelectronics fabrication whose schematic cross-sectional diagram is illustrated in FIG. 1, including the series of structures which forms the field effect transistor (FET) formed within and upon the first of the active regions of the semiconductor substrate 10, as well as the metal silicide layer 22 formed upon the semiconductor substrate 10 within the second of the two active regions of the semiconductor substrate.

Methods and materials through which blanket planarized inter-polysilicon oxide (IPO) dielectric layers may be formed within integrated circuits are known in the art of integrated circuit microelectronics fabrication. Blanket planarized inter-polysilicon oxide (IPO) dielectric layers may be formed within integrated circuit microelectronics fabrications through planarizing, through planarizing methods as are conventional in the art of integrated circuit microelectronics fabrication, of blanket conformal inter-polysilicon oxide (IPO) dielectric layers formed within integrated circuit microelectronics fabrications. Blanket conformal inter-polysilicon oxide (IPO) dielectric layers may be formed within integrated circuit microelectronics fabrications through methods including but not limited to chemical vapor deposition (CVD) methods, plasma enhanced chemical vapor deposition (PECVD) methods and physical vapor deposition (PVD) sputtering methods, to form blanket conformal inter-polysilicon oxide (IPO) dielectric layers typically of silicon oxide dielectric materials. For the preferred embodiment of the present invention, the blanket planarized inter-polysilicon oxide (IPO) dielectric layer 24 is preferably formed through planarizing, through a chemical mechanical polish (CMP) planarizing method as is conventional in the art of integrated circuit microelectronics fabrication, a blanket conformal inter-polysilicon oxide (IPO) dielectric layer formed of a silicon oxide dielectric material formed through a plasma enhanced chemical vapor deposition (PECVD) method, as is common in the art of integrated circuit microelectronics fabrication. Other methods and materials may, however, be employed in forming the blanket planarized inter-polysilicon oxide (IPO) dielectric layer 24. Preferably, the blanket planarized inter-polysilicon oxide (IPO) dielectric layer 24 so formed is formed to a thickness of from about 2000 to about 6000 angstroms.

Figure 2:
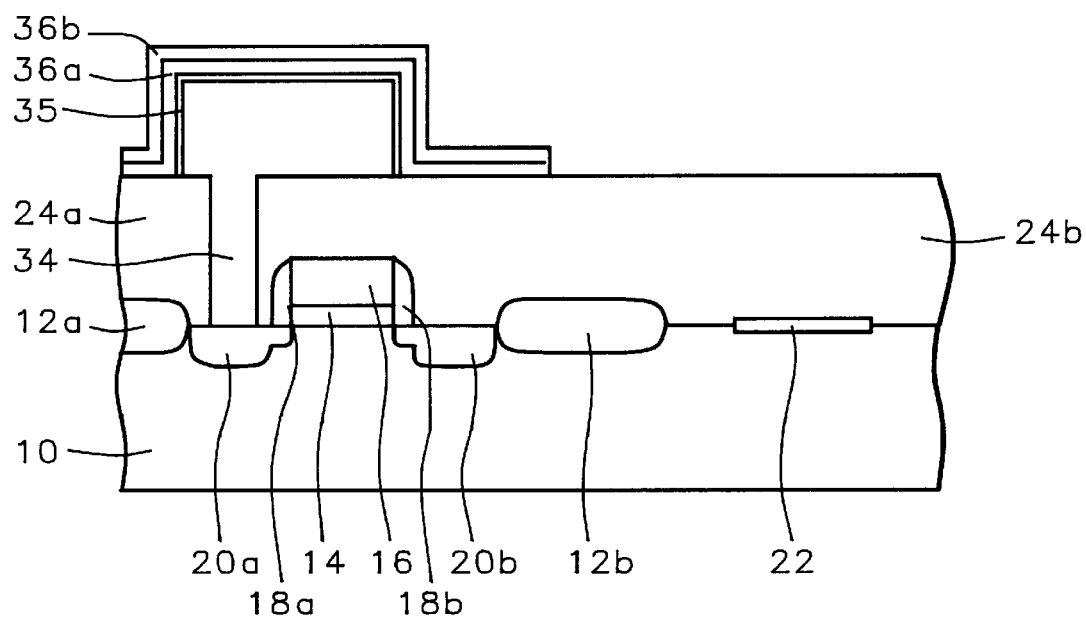

Referring now to FIG. 2, there is shown a schematic cross-sectional diagram illustrating the results of further processing of the integrated circuit microelectronics fabrication whose schematic cross-sectional diagram is illustrated in FIG. 1. Shown in FIG. 2 is a schematic cross-sectional diagram of an integrated circuit microelectronics fabrication otherwise equivalent to the integrated circuit microelectronics fabrication whose schematic cross-sectional diagram is illustrated in FIG. 1, but wherein, in-part, the blanket planarized inter-polysilicon oxide (IPO) dielectric layer 24 has been patterned to form a pair of patterned planarized inter-polysilicon oxide (IPO) dielectric layers 24a and 24b which define a contact via which accesses and exposes the source/drain region 20a. The blanket planarized inter-polysilicon oxide (IPO) dielectric layer 24 may be patterned to form the pair of patterned planarized inter-polysilicon oxide (IPO) dielectric layers 24a and 24b through methods as are conventional in the art, which methods will typically include, but are not limited to, plasma etch methods.

There is also shown in FIG. 2 formed into the contact via defined by the pair of patterned planarized inter-polysilicon oxide (IPO) dielectric layers 24a and 24b a first capacitor plate layer 34. Methods and materials through which capacitor plate layers may be formed within integrated circuit microelectronics fabrications are known in the art of integrated circuit microelectronics fabrication. Capacitor plate layers may be formed within integrated circuit microelectronics fabrications through methods including but not limited to thermally assisted evaporation methods, electron beam assisted evaporation methods, chemical vapor deposition (CVD) methods and physical vapor deposition (PVD) sputtering methods through which may be formed capacitor plate layers of capacitor plate materials including but not limited to doped polysilicon materials and polycide materials. For the preferred embodiment of the present invention, the first capacitor plate layer 34 is preferably formed of a doped polysilicon capacitor plate material formed into the contact via defined patterned planarized inter-polysilicon oxide (IPO) dielectric layers 24a and 24b and formed in-part upon adjoining portions of the patterned planarized inter-polysilicon oxide (IPO) dielectric layers 24a and 24b. The first capacitor plate layer 34 is preferably formed upon the patterned planarized inter-polysilicon oxide (IPO) dielectric layers 24a and 24b to a thickness of from about 500 to about 2000 angstroms and at a resistivity of no less than about 200 ohms per square. As is illustrated in FIG. 2, there is formed upon exposed portions of the first capacitor plate layer 34 a native silicon oxide dielectric layer 35.

Finally, there is also shown in FIG. 2 the presence of (1) a first silicon nitride layer 36a formed upon the native silicon oxide dielectric layer 35 and bridging to the patterned planarized inter polysilicon oxide (IPO) dielectric layers 24a and 24b; and (2) a second silicon nitride layer 36b formed upon the first silicon nitride layer 36a. Methods and materials through which silicon nitride layers may be formed within integrated circuit microelectronics fabrications are known in the art of integrated circuit microelectronics fabrication. Silicon nitride layers may be formed within integrated circuit microelectronics fabrications through methods including but not limited to chemical vapor deposition (CVD), plasma enhanced chemical vapor deposition (PECVD) methods and physical vapor deposition (PVD) sputtering methods through which may be formed silicon nitride layers while employing suitable silicon source materials and nitrogen source materials. Within the preferred embodiment of the present invention, the first silicon nitride layer 36a is formed through a first deposition method and the second silicon nitride layer 36b is formed through a second deposition method, where the first deposition method and the second deposition method may be selected from any of the foregoing deposition methods. More preferably, within the preferred embodiment of the present invention the first deposition method is the same as the second deposition method and undertaken within the same deposition reactor chamber, but the first deposition method and the second deposition method are separated by a purge of the deposition reactor chamber to assure that the second silicon nitride layer 36b is formed as a discrete silicon nitride layer upon the first silicon nitride layer 36a. Most preferably, within the preferred embodiment of the present invention each of the first silicon nitride layer 36a and the second silicon nitride layer 36b is formed through a chemical vapor deposition (CVD) employing dichlorosilane as a silicon source material and ammonia as a nitrogen source material within the same chemical vapor deposition (CVD) reactor chamber, but separated by a vacuum purge of the chemical vapor deposition (CVD) reactor chamber to assure that the second silicon nitride layer 36b is formed as a discrete silicon nitride layer upon the first silicon nitride layer 36a.

Preferably, the chemical vapor deposition (CVD) method employed in forming the first silicon nitride layer 36a and the second silicon nitride layer 36b also employs: (1) a reactor chamber pressure of from about 20 to about 40 pa; (2) a semiconductor substrate 10 temperature of from about 600 to about 700 degrees centigrade; (3) a dichlorosilane flow rate of from about 0.2 to about 0.4 standard liters per minute (slpm); (4) an ammonia flow rate of from about 0.1 to about 0.2 standard liters per minute (slpm); and (5) a background nitrogen flow rate of from about 0.005 to about 0.015 standard liters per minute (slpm). When employing within the chemical vapor deposition (CVD) method a preferred deposition time for each of the first silicon nitride layer 36a and the second silicon nitride layer 36b of from about 15 to about 25 minutes, each of the first silicon nitride layer 36a and the second silicon nitride layer 36b is preferably formed to a thickness of from about 20 to about 30 angstroms. Interposed between forming the first silicon nitride layer 36a through the first chemical vapor deposition (CVD) method and the second silicon nitride layer 36b through the second chemical vapor deposition (CVD) method is preferably: (1) at least one nitrogen and/or ammonia purge at the above noted flow rates for a nitrogen and/or ammonia purge time of from about 1 to about 5 minutes; and (2) at least one vacuum pump down and purge for a vacuum purge time of from about 10 to about 60 minutes.

While not wishing to be bound by any specific theory of operation of the present invention, it is believed that when employing the multilayer silicon nitride layer formed from the first silicon nitride layer 36a and the second silicon nitride layer 36b to subsequently form from the multilayer silicon nitride layer a silicon nitride/silicon oxide (NO) layer through a thermal oxidation method, there is avoided pinholes formed completely through the silicon nitride/silicon oxide (NO) layer, which pinholes would otherwise contribute to degraded dielectric properties of the silicon nitride/silicon oxide (NO) dielectric layer absent thermal annealing through the thermal oxidation method at an elevated thermal annealing temperature and/or an increased thermal annealing exposure time. Such degraded dielectric properties would be manifested as properties including but not limited to decreased silicon nitride/silicon oxide (NO) dielectric layer breakdown voltages and increased silicon nitride/silicon oxide (NO) dielectric layer leakage currents.

Similarly, as is also understood by a person skilled in the art, while the preferred embodiment of the present invention illustrates a bilayer multilayer silicon nitride layer comprising a first silicon nitride layer 36a and a second silicon nitride layer 36b each formed to a thickness of from about 20 to about 30 angstroms, within the general method of the present invention there may be formed additional silicon nitride layers when forming a multilayer silicon nitride layer which is subsequently oxidized through a thermal oxidation method to form a silicon nitride/silicon oxide (NO) layer. Within the general method of the present invention, each silicon nitride layer within a multilayer silicon nitride layer is preferably at least about 20 angstroms thick, as silicon nitride layers formed less thick typically suffer from increased defect levels.

Figure 3:
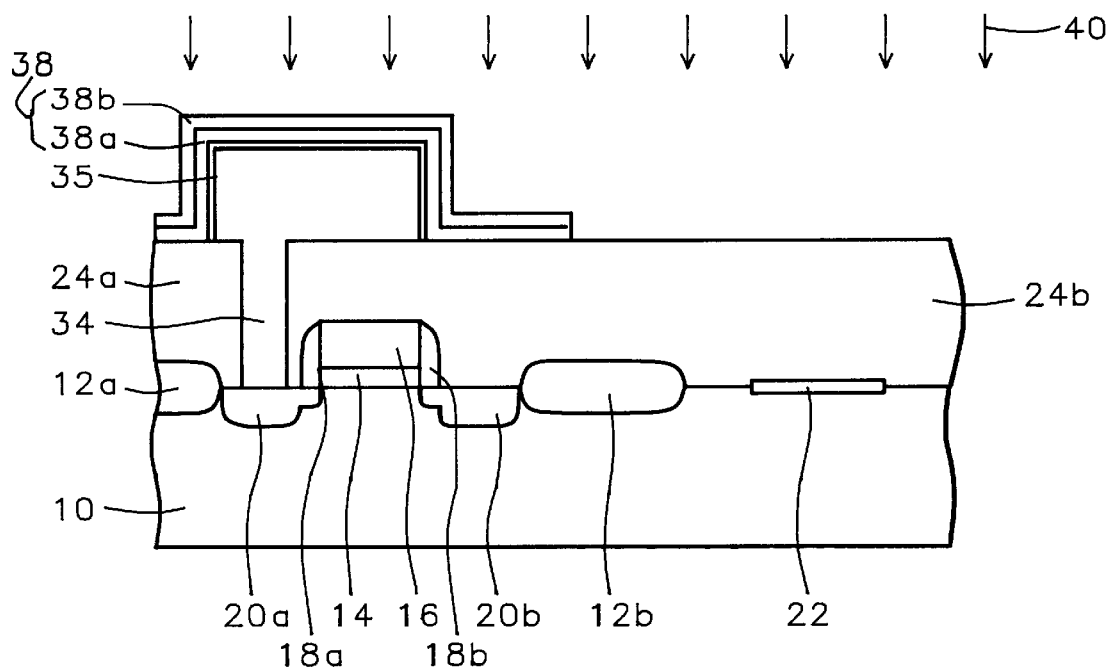

Referring now to FIG. 3, there is shown a schematic cross-sectional diagram of an integrated circuit microelectronics fabrication illustrating the results of further processing of the integrated circuit microelectronics fabrication whose schematic cross-sectional diagram is illustrated in FIG. 2. Shown in FIG. 3 is a schematic cross-sectional diagram of an integrated circuit microelectronics fabrication otherwise equivalent to the integrated circuit microelectronics fabrication whose schematic cross-sectional diagram is illustrated in FIG. 2, but wherein the first silicon nitride layer 36a and the second silicon nitride layer 36b within the multilayer silicon nitride layer have been thermally oxidized through annealing within a thermal oxidizing atmosphere 40 to form the silicon nitride/silicon oxide (NO) layer 38 which comprises a thermally oxidized silicon nitride layer 38a and a capacitive silicon oxide dielectric layer 38b. Within the preferred embodiment of the present invention, the first silicon nitride layer 36a and the second silicon nitride layer 36b may be thermally oxidized to form the silicon nitride/silicon oxide (NO) layer 38 through thermal annealing within oxidizing atmospheres as are conventional in the art, including but not limited to oxygen containing oxidizing atmospheres, ozone containing oxidizing atmospheres, nitrous oxide containing oxidizing atmospheres and nitric oxide containing oxidizing atmospheres, where the thermal annealing is undertaken through methods including but not limited to conventional furnace thermal annealing methods.

Although not specifically illustrated by the schematic cross-sectional diagrams of FIG. 2 and FIG. 3, it is preferred, although not required, within the preferred embodiment of the present invention that the first silicon nitride layer 36a and the second silicon nitride layer 36b be thermally annealed to form the silicon nitride/silicon oxide (NO) layer 38 through thermal annealing within an oxidizing atmosphere within the same reactor chamber within which is formed the first silicon nitride layer 36a and the second silicon nitride layer 36b. Under such circumstances there is typically realized manufacturing efficiency increases in forming the integrated circuit microelectronics fabrication whose schematic cross-sectional diagram is illustrated in FIG. 3.

For the preferred embodiment of the present invention, the first silicon nitride layer 36a and the second silicon nitride layer 36b are preferably thermally oxidized through thermal annealing within the thermal oxidizing atmosphere 40 to form the silicon nitride/silicon oxide (NO) layer 38, where the thermal oxidizing atmosphere 40 comprises an oxygen containing atmosphere within a conventional thermal annealing furnace. Preferably, the thermal oxidation method also employs: (1) an oxidation furnace pressure of from about 10 to about 40 pa; (2) a thermal annealing temperature of from about 600 to about 850 degrees centigrade (more preferably from about 600 to about 700 degrees centigrade); (3) an oxygen flow rate of from about 5 to about 15 standard liters per minute (slpm); and (4) a thermal annealing exposure time of from about 30 to about 90 minutes. Other methods and materials may, however, be employed in thermally annealing the first silicon nitride layer 36a and the second silicon nitride layer 36b when forming the silicon nitride/silicon oxide (NO) layer 38.

When thermally oxidizing the first silicon nitride layer 36a and the second silicon nitride layer 36b within the thermally oxidizing atmosphere 40, it is believed that the first silicon nitride layer 36a and the second silicon nitride layer 36b density somewhat in forming the thermally oxidized silicon nitride layer 38a and that silicon diffuses from within or through the thermally oxidized silicon nitride layer 38a to form the capacitive silicon oxide dielectric layer 36b. Some silicon oxynitride material may incidentally be formed at the interface of the thermally oxidized silicon nitride layer 38a and the capacitive silicon oxide dielectric layer 36b. Within the preferred embodiment of the present invention employing methods and materials as disclosed above, the thermally oxidized silicon nitride layer 38a is typically and preferably formed to a thickness of from about 5 to about 20 angstroms upon the native silicon oxide dielectric layer 35 while the capacitive silicon oxide dielectric layer 38b is typically and preferably formed to a thickness of from about 10 to about 20 angstroms upon the thermally oxidized silicon nitride layer 38a.

Figure 4:
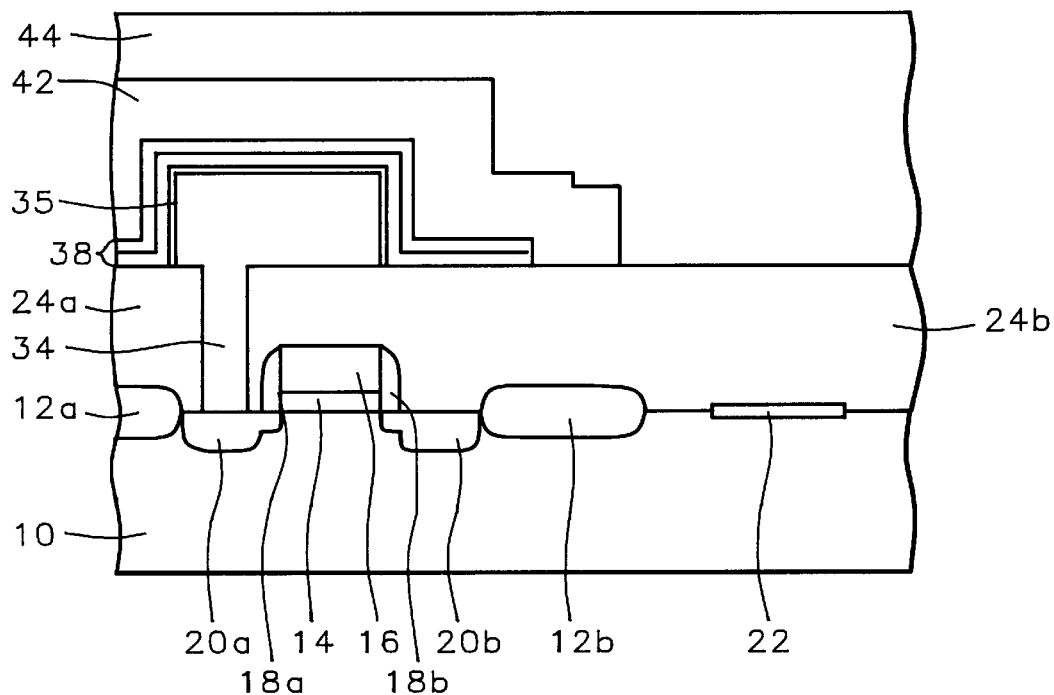

Referring now to FIG. 4, there is shown a schematic cross-sectional diagram of an integrated circuit microelectronics fabrication illustrating the results of further processing of the integrated circuit microelectronics fabrication whose schematic cross-sectional diagram is illustrated in FIG. 3. Shown in FIG. 4 is a schematic cross-sectional diagram of an integrated circuit microelectronics fabrication otherwise equivalent to the integrated circuit microelectronics fabrication whose schematic cross-sectional diagram is illustrated in FIG. 4, but wherein, in part, there is formed upon the silicon nitride/silicon oxide (NO) layer 38a second capacitor plate layer 42. Within the preferred embodiment of the present invention, the second capacitor plate layer 42 is preferably formed through methods and materials, and to a thickness, analogous or equivalent to the methods, materials and thickness to which is formed the first capacitor plate layer 34 as illustrated originally in FIG. 2.

Upon forming the second capacitor plate layer 42, there is formed within the integrated circuit microelectronics fabrication whose schematic cross-sectional diagram is illustrated in FIG. 4 a dynamic random access memory (DRAM) cell having formed therein a storage capacitor which in turn has formed therein a silicon oxide/silicon nitride/silicon oxide (ONO) capacitive dielectric layer which is formed in-part through thermally oxidizing a bilayer multilayer silicon nitride layer in accord with the preferred embodiment of the present invention. The silicon oxide/silicon nitride/silicon oxide (ONO) capacitive dielectric layer is formed from the native silicon oxide dielectric layer 35 and the silicon nitride/silicon oxide (NO) layer 38 which in turn is formed from the thermally oxidized silicon nitride layer 38a and the capacitive silicon oxide dielectric layer 38b. The silicon nitride/silicon oxide (NO) layer 38 within the silicon oxide/silicon nitride/silicon oxide (ONO) capacitive dielectric layer so formed is formed at a reduced thermal annealing temperature and/or a reduced thermal annealing exposure time in comparison with thermal annealing temperatures and/or thermal annealing exposure times which are employed in forming silicon nitride/silicon oxide (NO) layers from monolayer silicon nitride layers as are otherwise conventional in the art of integrated circuit microelectronics fabrications. Thus, there may be formed within or adjoining the dynamic random access memory (DRAM) cell in accord with the preferred embodiment of the present invention other integrated structures and other integrated circuit layers while avoiding thermal oxidation induced deterioration of those other integrated circuit structures and other integrated circuit layers. In particular, within the preferred embodiment of the present invention there is avoided thermal oxidation induced deterioration of the metal silicide layer 22 manifested as contact resistance increases of the metal silicide layer 22.

There is also shown in FIG. 4 the presence of a blanket planarized inter-level dielectric (ILD) layer 44 formed over the integrated circuit microelectronics fabrication including the storage capacitor formed within the dynamic random access memory (DRAM) cell. The blanket planarized inter-level dielectric (ILD) layer 44 as illustrated in the schematic cross-sectional diagram of FIG. 4 is preferably formed through methods and materials analogous or equivalent to the methods and materials employed in forming the blanket planarized inter-polysilicon oxide (IPO) dielectric layer 24 as illustrated in FIG. 1. However, the thickness dimensions of the blanket planarized inter-level dielectric (ILD layer 44 and the blanket planarized inter-polysilicon oxide (IPO) dielectric layer 24 will typically and preferably differ.

Figure 5:
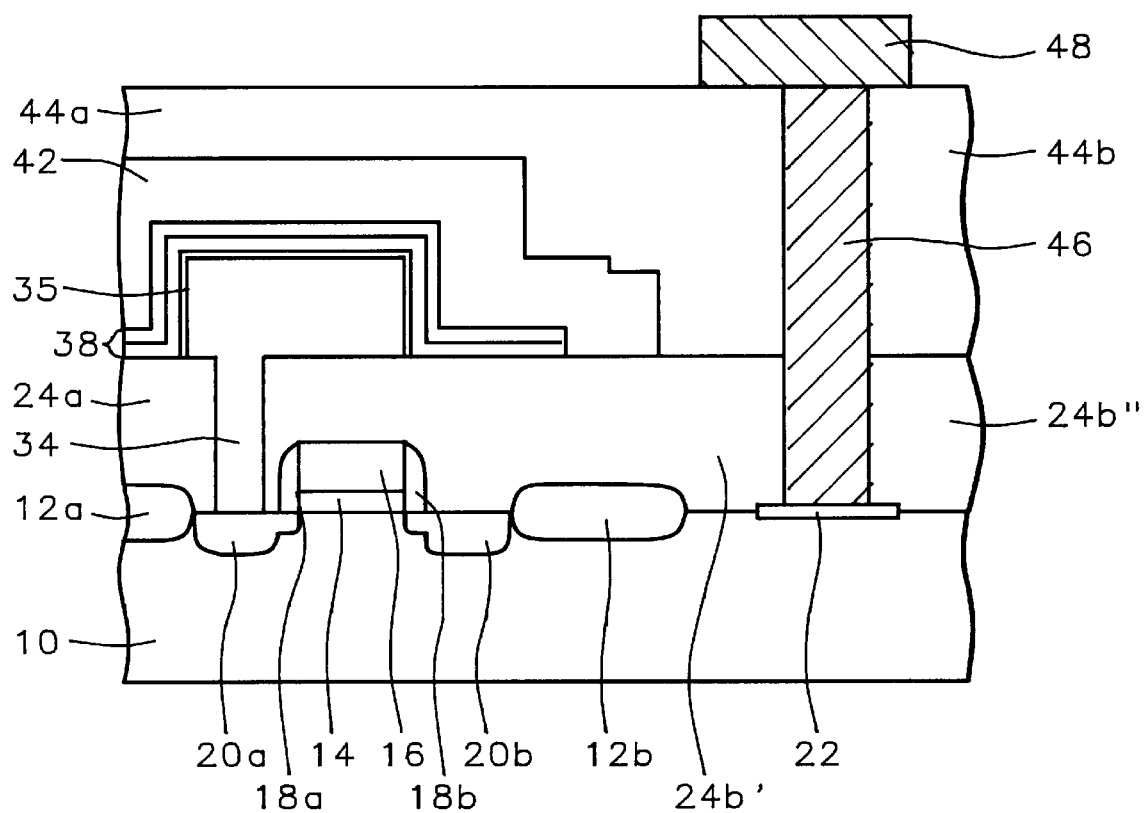

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is illustrated in FIG. 4, but wherein the blanket planarized inter-level dielectric (ILD) layer 44 and the patterned planarized inter-polysilicon oxide (IPO) dielectric layer 24b are patterned to form the patterned planarized inter-level dielectric (ILD) layers 44a and 44b and the corresponding twice patterned planarized inter-polysilicon oxide (IPO) dielectric layers 24b' and 24b" which in the aggregate define a second contact via which accesses the metal silicide layer 22. Within the preferred embodiment of the present invention, methods and materials through the second contact via is formed through the blanket planarized inter-level dielectric (ILD) layer 44 and the patterned planarized inter-polysilicon oxide (IPO) dielectric layer 24b are preferably analogous or equivalent to the methods and materials through which the contact via accessing the source/drain region 20a is formed through the blanket planarized inter-polysilicon oxide (EPO) dielectric layer 24 as illustrated in FIG. 1 to form the patterned planarized inter-polysilicon oxide (IPO) dielectric layers 24a and 24b as illustrated in FIG. 2.

There is also shown in FIG. 5 formed into the second contact via a conductive contact stud layer 46, and there is finally shown in FIG. 5 formed contacting the conductive contact stud layer 46 a patterned first conductor layer 48. Methods and materials through which the conductive contact stud 46 and the patterned first conductor layer 48 may be formed are conventional in the art of integrated circuit microelectronics fabrication. Typically, although not exclusively, the conductive contact stud layer 46 is formed at least in part of a tungsten containing conductor material. Similarly typically, although not exclusively, the patterned first conductor layer 48 is formed at least in part of an aluminum containing conductor material.

EXAMPLES

Upon each semiconductor substrate within a first series of semiconductor substrates was formed a titanium silicide layer through thermal annealing at a temperature of about 730 degrees centigrade of a corresponding titanium layer of thickness about 300 angstroms formed upon each semiconductor substrate. The titanium silicide layers so formed were each formed to a thickness of about 400 angstroms.

Upon each semiconductor substrate within a second series of semiconductor substrates was formed a native silicon oxide layer. Upon each native silicon oxide layer was then formed a monolayer silicon nitride layer at a thickness of about 50 angstroms through a chemical vapor deposition (CVID) method employing dichlorosilane as a silicon source material and ammonia as a nitrogen source material. The chemical vapor deposition method also employed: (1) a reactor chamber pressure of about 30 pa; (2) a semiconductor substrate temperature of about 650 degrees centigrade; (3) a dichlorosilane flow rate of about 0.3 standard liters per minute (slpm); (4) an ammonia flow rate of about 0.2 standard liters per minute (slpm); and (5) a background nitrogen flow rate of about 0.01 standard liters per minute (slpm), for a deposition time of about 40 minutes.

Upon each semiconductor substrate within a third series of semiconductor substrates was also formed a native silicon oxide layer. Upon each native silicon oxide layer was formed a bilayer multilayer silicon nitride layer wherein each of the two silicon nitride layers within the bilayer multilayer silicon nitride layer had a thickness of one half the thickness of the monolayer silicon nitride layers formed over each semiconductor substrate within the second series of semiconductor substrates. The bilayer silicon nitride layers were formed in accord with the preferred embodiment of the present invention and employed conditions otherwise equivalent to the conditions employed in forming the monolayer silicon nitride layers upon each semiconductor substrate within the second series of semiconductor substrates, with the exception that the bilayer multilayer silicon nitride layers were formed as two discrete silicon nitride layers separated by: (1) a pair of nitrogen and ammonia purges under conditions employed for the silicon nitride layer depositions; and (2) a vacuum purge at a reactor chamber base pressure.

Samples of semiconductor substrates from within the first series of semiconductor substrates, the second series of semiconductor substrates and the third series of semiconductor substrates were then exposed to various thermal oxidation methods employing thermal annealing temperatures and thermal annealing exposure times typically employed within integrated circuit microelectronics fabrication to form from silicon nitride layers silicon nitride/silicon oxide (NO) layers. All of the thermal oxidation methods employed: (1) a reactor chamber pressure of about 10 pa; and (2) an oxygen flow rate of about 7000 standard cubic centimeters per minute (sccm).

The sheet resistances of the titanium silicide layers, as well as the leakage currents and the breakdown voltages of the silicon oxide/silicon nitride/silicon oxide (ONO) layers formed employing the monolayer silicon nitride layers or the bilayer silicon nitride layers were then determined through electrical test measurement methods as are conventional in the art of integrated circuit microelectronics fabrication. The measured values of those electrical parameters as a function of thermal annealing temperature and thermal annealing exposure time are reported in Table I, where sheet resistances of titanium silicide layers are reported in units of ohms per square, breakdown voltages of silicon oxide/silicon nitride/silicon oxide (ONO) layers are reported in volts and leakage currents of silicon oxide/silicon nitride/silicon oxide (ONO) layers are reported as currents measured at 1.7 volts. As is understood by a person skilled in the art, the breakdown voltages are directly related to silicon oxide/silicon nitride/silicon oxide (ONO) layer resistivity, while the leakage currents are inversely related to silicon oxide/silicon nitride/silicon oxide (ONO) layer resistivity.

TABLE I

| Th/Ox Conditions | TiSix-Rs (ohm/sq)(N+) | Monolayer ONO Vb(V) | Monolayer ONO I@1.7 V | Bilayer ONO Vb(V) | Bilayer ONO I@1.7 V |
|---|---|---|---|---|---|
| 800 C.- 30 minutes | 50 | 5.6 | 210 pA | 5 | 100 pA |
| 750 C.- 1 hour | 20 | 1.8 | 1 uA | — | — |
| 750 C.- 2 hours | 30 | 5.5 | 210 pA | — | — |
| 700 C.- 1 hour | 10 | 0.2 | >>1 uA | 5 | 100 pA |
| 700 C.- 4 hours | 20 | 5.3 | 200 pA | — | — |

As is seen from review of the data within Table I, an optimally low titanium silicide sheet resistance is obtained at a thermal oxidation condition employing a 700 degrees centigrade thermal annealing temperature for a one hour thermal annealing exposure time, while still providing optimally high breakdown voltage and low leakage current of a silicon oxide/silicon nitride/silicon oxide (ONO) layer formed in part through thermal oxidation of a bilayer silicon nitride layer formed in accord with the preferred embodiment of the present invention. An otherwise equivalent silicon oxide/silicon nitride/silicon oxide (ONO) layer formed through thermal oxidation of a monolayer silicon nitride layer at the equivalent thermal oxidation condition is formed with substantially degraded dielectric properties. Thus, through the method of the present invention there may be formed a silicon nitride/silicon oxide (NO) layer within a silicon oxide/silicon nitride/silicon oxide (ONO) layer within a microelectronics fabrication through thermal oxidation of a silicon nitride layer within the microelectronics fabrication while avoiding thermal oxidation induced deterioration of other microelectronics structures and microelectronics layers within the microelectronics fabrication.

As is understood by a person skilled in the art, the preferred embodiment and examples of the present invention are illustrative of the present invention rather than limiting of the present invention. Revisions and modifications may be made to methods, materials, structures and dimensions through which are provided the preferred embodiment and examples of the present invention while still providing embodiments and examples which are within the spirit and scope of the present invention, as defined by the accompanying claims.

What is claimed is:

1. A method for forming a silicon nitride/silicon oxide (NO) layer within a microelectronics fabrication comprising:

providing a substrate employed within a microelectronics fabrication;

forming over the substrate a first silicon nitride layer through a first deposition method;

forming directly upon the first silicon nitride layer a minimum of a second silicon nitride layer through a second deposition method; and annealing thermally in an oxidizing environment at least the first silicon nitride layer and the second silicon nitride layer to form therefrom a silicon nitride/silicon oxide (NO) layer stopping silicon nitride deposition after deposition of the first silicon nitride layer, and restarting silicon nitride deposition before the deposition of the second silicon nitride layer.

2. The method of claim 1 wherein:

the first silicon nitride layer and the second silicon nitride layer are thermally annealed at a temperature of from about 600 to about 700 degrees centigrade for a time period of from about 30 to about 90 minutes; and the silicon nitride/silicon oxide (NO) layer is formed with a first resistivity higher than a second resistivity of a second silicon nitride/silicon oxide (NO) layer formed through thermal annealing in the oxidizing environment at the temperature of from about 600 to about 700 degrees centigrade for the time period of from about 30 to about 90 minutes of a single silicon nitride layer of thickness equal to the thickness of the first silicon nitride layer plus the thickness of the second silicon nitride layer.

3. The method of claim 1 wherein the microelectronics fabrication is chosen from the group of microelectronics fabrications consisting of integrated circuit microelectronics fabrications, solar cell microelectronics fabrications, ceramic packaging microelectronics fabrications and flat panel display microelectronics fabrications.

4. The method of claim 1 wherein:

the first deposition method and the second deposition method are thermal chemical vapor deposition (CVD) methods; and the first silicon nitride layer and the second silicon nitride layer are each formed to a thickness of from about 20 to about 30 angstroms.

5. The method of claim 1 further comprising forming over the substrate a first silicon oxide layer prior to forming over the substrate the first silicon nitride layer and the second silicon nitride layer, the first silicon nitride layer being formed upon the first silicon oxide layer, thus forming employing the silicon nitride/silicon oxide (NO) layer a silicon oxide/silicon nitride/silicon oxide (ONO) layer.

6. A method for forming a silicon nitride/silicon oxide (NO) dielectric layer within a capacitor within a microelectronics fabrication comprising:

providing a substrate employed within a microelectronics fabrication;

forming over the substrate a first capacitor plate layer;

forming over the first capacitor plate layer a first silicon nitride layer through a first deposition method;

forming directly upon the first silicon nitride layer a minimum of a second silicon nitride layer through a second deposition method;

annealing thermally in an oxidizing environment at least the first silicon nitride layer and the second silicon nitride layer to form therefrom a silicon nitride/silicon oxide (NO) layer; and forming over the silicon nitride/silicon oxide (NO) layer a second capacitor plate layer stopping silicon nitride deposition after deposition of the first silicon nitride layer, and restarting silicon nitride deposition before the deposition of the second silicon nitride layer.

7. The method of claim 6 wherein:

the first silicon nitride layer and the second silicon nitride layer are thermally annealed at a temperature of from about 600 to about 700 degrees centigrade for a time period of from about 30 to about 90 minutes; and the silicon nitride/silicon oxide (NO) layer is formed with a first resistivity higher than a second resistivity of a second silicon nitride/silicon oxide (NO) layer formed through thermal annealing in the oxidizing environment at the temperature of from about 600 to about 700 degrees centigrade for the time period of from about 30 to about 90 minutes of a single silicon nitride layer of thickness equal to the thickness of the first silicon nitride layer plus the thickness of the second silicon nitride layer.

8. The method of claim 6 wherein the microelectronics fabrication is chosen from the group of microelectronics fabrications consisting of integrted circuit microelectronics fabrications, solar cell microelectronics fabrications, ceramic packaging microelectronics fabrications and flat panel display microelectronics fabrications.

9. The method of claim 6 wherein:

the first deposition method and the second deposition method are chemical vapor deposition (CVD) methods; and the first silicon nitride layer and the second silicon nitride layer are each formed to a thickness of from about 20 to about 30 angstroms.

10. The method of claim 7 further comprising forming over the first capacitor plate layer a first silicon oxide layer prior to forming over the first capacitor plate layer the first silicon nitride layer and the second silicon nitride layer, the first silicon nitride layer being formed upon the first silicon oxide layer, thus forming employing the silicon nitride/ silicon oxide (NO) layer a silicon oxide/silicon nitride/ silicon oxide (ONO) layer.

11. A method for forming a dynamic random access memory (DRAM) cell within an integrated circuit microelectronics fabrication comprising:

providing a semiconductor substrate having an active region defined therein;

forming within and upon the active region of the semiconductor substrate a field effect transistor (FET), the field effect transistor comprising a gate dielectric layer formed upon the active region of the semiconductor substrate;

a gate electrode formed upon the gate dielectric layer; and a first source/drain region and a second source/drain region formed within the active region of the semiconductor substrate at areas not covered by the gate electrode;

forming a first capacitor plate layer electrically communicating with the first source/drain region;

forming over the first capacitor plate layer a first silicon nitride layer formed through a first deposition method;

forming directly upon the first silicon nitride layer a minimum of a second silicon nitride layer through a second deposition method;

annealing thermally in an oxidizing environment at least the first silicon nitride layer and the second silicon nitride layer to form therefrom a silicon nitride/silicon oxide (NO) layer; and forming over the silicon nitride/silicon oxide (NO) layer a second capacitor plate layer stopping silicon nitride deposition after deposition of the first silicon nitride layer, and restarting silicon nitride deposition before the deposition of the second silicon nitride layer.

12. The method of claim 11 wherein:

the first silicon nitride layer and the second silicon nitride layer are thermally annealed at a temperature of from about 600 to about 700 degrees centigrade for a time period of from about 30 to about 90 minutes.

13. The method of claim 11 wherein the silicon nitride/ silicon oxide (NO) layer is formed with a first resistivity higher than a second resistivity of a second silicon nitride/ silicon oxide (NO) layer formed through thermal annealing in the oxidizing environment at the temperature of from about 600 to about 700 degrees centigrade for the time period of from about 30 to about 90 minutes of a single silicon nitride layer of thickness equal to the thickness of the first silicon nitride layer plus the thickness of the second silicon nitride layer.

14. The method of claim 11 wherein:

the first deposition method and the second deposition method are chemical vapor deposition (CVD) methods; and the first silicon nitride layer and the second silicon nitride layer are each formed to a thickness of from about 20 to about 30 angstroms.

15. The method of claim 11 further comprising forming over the first capacitor plate layer a first silicon oxide layer prior to forming over the first capacitor plate layer the first silicon nitride layer and the second silicon nitride layer, the first silicon nitride layer being formed upon the first silicon oxide layer, thus forming employing the silicon nitride/ silicon oxide (NO) layer a silicon oxide/silicon nitride/ silicon oxide (ONO) layer.

* * * * *